United States Patent
Ishii et al.

(10) Patent No.: US 6,395,452 B1
(45) Date of Patent: May 28, 2002

(54) PHOTOSENSITIVE RESIN AND PHOTOSENSITIVE RESIN COMPOSITION

(75) Inventors: Kenji Ishii; Isao Hagiwara; Toru Harada; Jun Yokoyama, all of Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/516,456

(22) Filed: Mar. 1, 2000

(30) Foreign Application Priority Data

Mar. 9, 1999 (JP) ............................................. 11-061075

(51) Int. Cl.$^7$ ............................................. C08G 73/00
(52) U.S. Cl. .................. 430/280.1; 522/100; 528/103.5
(58) Field of Search ...................... 430/280.1; 522/100; 528/99, 101, 103.5, 291, 370

(56) References Cited

U.S. PATENT DOCUMENTS

| 4,393,195 A | 7/1983 | Gaku et al. | .................. 528/361 |
|---|---|---|---|
| 4,533,727 A | 8/1985 | Gaku et al. | .................. 528/361 |
| 4,554,346 A | * 11/1985 | Gaku et al. | .................. 528/363 |

FOREIGN PATENT DOCUMENTS

| EP | 0 156 959 | 10/1985 | | |
|---|---|---|---|---|
| EP | 0 413 087 | 2/1991 | | |
| GB | 1374161 | 11/1974 | | |
| JP | 5-140251 | 6/1993 | | |
| JP | 2001048982 A | * 2/2001 | ........... | C08G/73/00 |
| WO | 95/07309 | 3/1995 | | |

* cited by examiner

Primary Examiner—Janet Baxter
Assistant Examiner—Yvette M. Clarke
(74) Attorney, Agent, or Firm—Wenderoth, Lind & Ponack, LLP

(57) ABSTRACT

Disclosed is a photosensitive resin which can give a photosensitive resin composition having excellent heat durability and excellent developability and showing excellent heat durability and excellent electric insulation reliability in a humidified state. The photosensitive resin composition contains the above photosensitive resin which is a reaction product produced by reacting an epoxy acrylate with a cyanate ester compound to obtain a reaction product (A) and reacting the reaction product (A) with a polybasic acid anhydride, and an epoxy resin.

8 Claims, No Drawings

PHOTOSENSITIVE RESIN AND PHOTOSENSITIVE RESIN COMPOSITION

FIELD OF THE INVENTION

The present invention relates to a photosensitive resin composition for use as a material for printed wiring boards and a photosensitive resin as a component of the above photosensitive resin composition. The photosensitive resin composition of the present invention is suitable for use as a material which has excellent resolving performances and high heat durability and which shows excellent heat durability and electric insulation in a humidified state.

PRIOR ART OF THE INVENTION

In recent years, it is desired to downsize and compact electronic machines and equipment, and it is therefore as well essential to comply with downsizing, a higher fineness and a decrease in weight and thickness with regard to printed wiring boards. A solder resist material to be applied onto a substrate has been generally selected from those materials which are ultraviolet-curable and developable with a diluted alkali and which is excellent in durability against soldering and solvents. However, "build-up" substrates having fine wirings inside recently come to encounter problems in the heat-resistance of a solder resist, such as a popcorn phenomenon which is caused between a solder resist/sealing resin interface. Further, it is also demanded to increase insulation reliability between lines of a closely packed wiring.

For improving electric insulation and heat resistance, there has been developed a resist containing a cyanate ester compound such as a bismaleimide-triazine resin (BT resin) (Japanese Patent Application No. 08-298641).

A cyanate ester compound is caused to remain during alkali development, and the steps of electroless nickel plating and electroless gold plating after the resist is applied is caused to have a problem.

SUMMARY OF THE INVENTION

It is an object of the present invention to provide a photosensitive resin which can give a photosensitive resin composition having high heat durability and excellent heat durability and electric insulation in a humidified state and having alkali-developability and developability free of problems caused during electroless plating, and a photosensitive resin composition containing the above photosensitive resin.

According to the present invention, there is provided a photosensitive resin (B) which is a reaction product produced by reacting an epoxy acrylate (a) with a cyanate ester compound (b) to obtain a reaction product (A) and reacting the reaction product (A) with a polybasic acid anhydride (c).

According to the present invention, further, there is provided a photosensitive resin composition comprising the above photosensitive resin (B) and an epoxy resin (d).

DETAILED DESCRIPTION OF THE INVENTION

For achieving the above object, the present inventors have made diligent studies and have found that the above object can be achieved by a resin which is produced by reacting an epoxy acrylate with a cyanate ester compound to obtain a reaction product and further reacting the reaction product with a polybasic acid anhydride. The present invention has been accordingly completed.

That is, the present invention is concerned with a photosensitive resin (B) which is a reaction product produced by reacting an epoxy acrylate (a) with a cyanate ester compound (b) to obtain a reaction product (A) and further reacting the reaction product (A) with a polybasic acid anhydride (c). Further, the present invention is concerned with a photosensitive resin composition comprising the above photosensitive resin (B) and an epoxy resin (d).

The epoxy acrylate (a) used in the present invention refers to a reaction product between an epoxy resin and an acrylic acid and is known, for example, in "UV Koka Gijutu Nyuumon (Introduction to UV Curing Technology)" (written by K. KATO and S. NAKAHARA, issued by Koubinshi Kankoukai, 1984). Specific examples of the epoxy acrylate (a) include bisphenol A type epoxy acrylate, bisphenol Z type epoxy acrylate, biphenol-epoxy acrylate, tetramethylbiphenol-epoxy acrylate, hexamethylbiphenol-epoxy acrylate, and xylenenovolak-epoxy acrylate. These epoxy acrylates may be used alone or in combination as required. Further, a reaction product of at least two epoxy acrylates of these may be also used. Of these, easily commercially available bisphenol A type epoxy acrylate is suitable.

The cyanate ester compound (b) used in the present invention refers to a compound containing at least one and generally five or less cyanato groups ($-O-C\equiv N$) per molecule, preferably an aromatic organic compound in which 2 to 5 cyanato groups bond directly to an aromatic ring.

Specific examples of the cyanate ester compound (b) include 1,3- or 1,4-dicyanatobenzene, 1,3,5-tricyanotobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-dicyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate and cyanates obtained by a reaction between novolak and cyan halide.

Further, there may be used polyfunctional cyanate ester compounds disclosed in Japanese Patent Publications Nos. 41-1928, 43-18468, 44-4791, 45-11712, 46-1112 and 47-26853 and JP-A-51-63149. These cyanate ester compounds may be used alone or in combination. These components have a remarkably low content level of impurities such as hydrolysable Cl and Na. These components serve to decrease the content of impurities as a whole when incorporated as one component in the present invention, so that the photosensitive resin and the photosensitive resin composition of the present invention are optimum as a peripheral material for semiconductors.

Further, there may be used a prepolymer having a molecular weight of 200 to 6,000 and having a triazine ring formed by dimerizing cyanato groups of any one of these polyfunctional cyanate ester compounds. The above prepolymer can be obtained by polymerizing the above polyfunctional cyanate ester monomer in the presence of a catalyst selected from acids such as mineral acid and Lewis acid, bases such as sodium alcoholate and tertiary amines, or salts such as sodium carbonate. The prepolymer partially contains unreacted monomer and has the form of a mixture of a monomer and a prepolymer, and the prepolymer in the above form is also suitably used in the present invention.

The polybasic acid anhydride (c) used in the present invention refers to a compound having an acid anhydride group derived from at least two carboxyl groups per molecule. Examples of the polybasic acid anhydride (c) include phthalic acid anhydride, trimellitic acid anhydride, pyromellitic acid anhydride, naphthalene-1,4,5,8-tetracarboxylic acid dianhydride, benzophenone tetracarboxylic acid anhydride, tetrahydropthalic acid anhydride, hexahydrophthalic acid anhydride, 4-methylhexahydropthalic acid anhydride, 3-methylhexahydrophthalic acid anhydride, succinic acid anhydride, dodecenylphthalic acid anhydride, ethylene glycolbis(anhydrotrimellitate), glecerin bis(anhydrotrimellitate), 3,3',4,4'-diphenylsulfonetetracaerboxylic acid dianhydride, 4,4'-hydroxydiphthalic acid anhydride, other compound having acid anhydride in molecule, and a composition containing one compound or at least two compounds of these.

The method of practicing the present invention will be explained below.

First, the epoxy acrylate (a) and the cyanate ester compound (b) are allowed to react at a temperature between 50° C. and 100° C. for 5 to 100 hours. Generally, the amount of the cyanate ester compound (b) per 100 parts by weight of the epoxy acrylate (a) is 5 to 40 parts by weight, preferably 10 to 30 parts by weight. When the amount of the cyanate ester compound (b) is smaller than the above lower limit, a resin composition containing the resultant resin poor in heat durability, humidity durability and electric insulation after a pressure cooker test. When the above amount is larger than the above upper limit, there is liable to be caused a problem that gelation takes place during the reaction.

A solvent may be used for adjusting viscosity during the reaction. The solvent is not specially limited, while it is preferably selected from those having a boiling point in a range in which they can evaporate when a coating of the photosensitive resin composition is dried. For example, the above solvent includes ketones such as acetone and methyl ethyl ketone, esters such as dipropylene glycol monomethyl ether acetate, dipropylene glycol monomethyl ether, diethylene glycol monomethyl ether acetate and diethyl ether monomethyl ether, and aromatic hydrocarbons such as solvent naphtha, toluene, xylene and ethylbeznene. These solvents may be used alone or in combination.

Then, for rendering the above-obtained resin alkali-developable, the resin is allowed to react with the polybasic acid anhydride (c) to form a carboxyl-group-containing resin.

The amount of the polybasic acid anhydride (c) per 100 parts by weight of the epoxy acrylate (a) is generally 10 to 90 parts by weight. In this case, the obtained resin has an acid value in the range of from 40 to 400 mgKOH/g. However, when the acid value in the range of from approximately 50 to 130, preferably 50 to 110, good developability is achieved. It is therefore preferred to adjust the amount of the polybasic acid anhydride (c) so as to attain the acid value in the above range. When the acid value is outside the preferred range, the acid value can be decreased by adding an epoxy compound as required to carry out a reaction, or the acid value can be increased by adding additional polybasic acid anhydride (c). By the above method, the photosensitive resin (B) can be obtained.

Further, a solvent can be used for adjusting the viscosity of the intended photosensitive resin, and the solvent can be selected from those described above.

The photosensitive resin composition can be prepared from the above photosensitive resin (B) and can be used in various fields.

When the photosensitive resin composition is used as a resist ink, the photosensitive resin composition is prepared by mixing the photosensitive resin (B) with an epoxy resin (d) which serves to improve various properties such as adhesion, heat durability and plating durability and a photopolymerization initiator (e) which works to initiate polymerization.

Examples of the above epoxy resin (d) include a bisphenol A type epoxy resin, a bisphenol F type epoxy resin, a biphenyl type epoxy resin, a novolak type epoxy resin, triglycidyl isocyanurate and an alicyclic epoxy resin. These epoxy resins may be used alone or in combination as required. Of these, triglycidyl isocyanurate is preferred since it undergoes a dark reaction at a lower rate during the drying of a resist ink. The weight of the epoxy resin (d) is required to be equivalent to, or greater than, the weight of carboxylic acid contained in the photosensitive resin. Generally, the content of the epoxy resin (d) in the composition is 50 parts by weight or less, preferably 3 to 45 parts by weight.

The above photopolymerization initiator (e) can be selected from known initiators. Specific examples of the photopolymerization initiator (e) include α-diketones such as benzyl and acetyl, acyloin ethers such as benzoin ethyl ether and benzoin propyl ether, thioxanthones such as thioxanthone and 2,4-diethylthioxanthone, benzophenones such as benzophenone and 4,4'-bis(dimethylamino) benzophenone, acetophenones such as acetophenone, 2,2'-dimethoxy-2-phenylacetophenone and β-methoxyacetophenone, quinones such as anthraquinone and 1,4-naphthoquinone, and peroxides such as di-tert-butyl peroxide. These initiators may be used alone or in combination. The amount of the polymerization initiator is 0.1 to 20% by weight, preferably 0.2 to 10% by weight.

The photosensitive resin composition can be prepared by homogeneously kneading the above components according to a generally known method using a three-roll mill, a homogenizer, or the like.

The photosensitive resin composition may contain known additives such as a filler, a curing promoter, an anti-foamer, a surface treating agent, a flame retardant, a pigment, a dye, and the like. The filler includes silicas such as natural silica, fused silica and amorphous silica, white carbon, titanium white, aerosil, alumina, talc, natural mica, synthetic mica, kaolin, clay, aluminum hydroxide, barium sulfate, E-glass, A-glass, G-glass, L-glass, D-glass, S-glass, M-glass and G-20 glass. The curing promoter includes imidazoles such as 2-methylimidazole, 2-ethyl-4-methylimidazole, 2-undecylimidazole, 2-heptadecylimidazole, 2-phenylimidazole and 1-benzyl-2-methylimidazole, tertiary amines such as benzyldimethylamine, and phosphorus compounds such as phosphine and phosphonium compounds.

When the photosensitive resin composition is used as a resist ink, the content of the photosensitive resin (B) in the photosensitive resin composition is preferably 30 to 90% by weight. When the content of the photosensitive resin (B) is less than 30% by weight, it is difficult to secure a uniform thickness of a layer formed of the composition, and the layer is destabilized in quality, so that the composition cannot stand up to a use for a printed wiring board. When the above content exceeds 90% by weight, an applied composition may peel off from a printed wiring board or may vary electric properties.

The photosensitive resin composition of the present invention is useful as a resist ink for an etching resist, a solder resist and a permanent resist such as an insulating resist for a "build-up" printed wiring board, and it can be also used as a coating composition, a coating agent or an adhesive.

Specifically, the photosensitive resin composition of the present invention is applied by a screen printing method, a spraying method, a roll coating method, an electrostatic method, a curtain coating method, or the like, to form a coating having a thickness of 10 to 160 μm, and the coating is dried at 60 to 110° C. Then, the coating is exposed to ultraviolet light (exposure) through a negative film, and a non-exposed portion is dissolved and removed with a dilute alkali (development). Further, for improving physical properties, the remaining coating is fully cured by irradiation with ultraviolet light (post exposure) or heating, to obtain a cured coating.

The light source for the exposure includes a low-pressure mercury lamp, an intermediate-pressure mercury lamp, a high-pressure mercury lamp, an ultrahigh-pressure mercury lamp, a xenon lamp and a metal halide lamp. The exposure is carried out at 100 to 2,000 mJ/cm$^2$, preferably 250 to 1,000 mJ/cm$^2$.

The development can be carried out by a known method such as a spraying method or a dipping method, and as a developer solution, there can be used a known dilute alkali aqueous solution, such as a sodium carbonate aqueous solution, a sodium hydroxide aqueous solution or an ammonium hydroxide aqueous solution. The content of the alkali chemical in the developer solution is properly 0.1 to 5.0% by weight. Further, the developing solution has a temperature between 5° C. and 50° C., preferably between 25° C. and 40° C. When the developer solution has a temperature lower than the above lower limit, the development may take a long time or there may be caused a development failure problem. When the developer solution has a temperature higher than the above upper limit, disadvantageously, even an exposed portion is liable to be dissolved.

After the development, generally, curing under heat is carried out. The heating temperature is set between 100° C. and 250° C., preferably between 120° C. and 200° C. When the temperature is lower than the above lower limit, the curing takes a long time. When it is higher than the above upper limit, there may be caused problems of discoloration and partial swelling.

EXAMPLES

The present invention will be more specifically explained with reference to Examples and Comparative Examples hereinafter, while the present invention shall not be limited by Examples. In Examples, "part" and "%" stand for "part by weight" and "% by weight" unless otherwise specified.

Synthetic Example 1

100 Parts of a bisphenol A type epoxy acrylate (trade name: SP1509, supplied by Showa Highpolymer), 5 parts of a bisphenol A type cyanate ester compound (trade name: BT2070, supplied by Mitsubishi Gas Chemical Co., Inc.) and 105 parts of a solvent containing dipropylene glycol monomethyl ether acetate and solvent naphtha (dipropylene glycol monomethyl ether acetate/solvent naphtha=50/50) were combined together, to prepare a mixture having a solid content of 50%.

While the mixture was stirred at 70° C., the mixture was allowed to react with monitoring a cyanate peak (around 2,300 cm$^{-1}$) based on an infrared absorption spectrum. After 5.5 hours, the cyanate peak disappeared, so that the reaction was terminated.

To the resultant reaction mixture were added 21.8 parts (corresponding to 50% of molar amount of epoxy acrylate) of pyromellitic acid anhydride and 21.8 parts of the same solvent as above. While the mixture was stirred at 70° C., the mixture was allowed to react with monitoring a carboxylic acid anhydride peak (around 1,850 cm$^{-1}$) based on an infrared absorption spectrum. After 6 hours, the carboxylic acid anhydride peak disappeared, so that the reaction was terminated.

The above-obtained resin (to be referred to as "resin (i)" hereinafter) had an acid value of 90.0 mgKOH/g.

Synthesis Example 2

A resin was obtained in the same manner as in Synthesis Example 1 except that the amount of BT2070 was changed to 10 parts and that the amount of pyromellitic acid anhydride was changed to 17.4 parts (corresponding to 40% of molar amount of epoxy acrylate).

The above-obtained resin (to be referred to as "resin (ii)" hereinafter) had an acid value of 75.0 mgKOH/g.

Synthesis Example 3

A resin was obtained in the same manner as in Synthesis Example 1 except that the amount of BT2070 was changed to 15 parts and that the amount of pyromellitic acid anhydride was changed to 13.8 parts (corresponding to 30% of molar amount of epoxy acrylate).

The above-obtained resin (to be referred to as "resin (iii)" hereinafter) had an acid value of 53.0 mgKOH/g.

Synthesis Example 4

A resin was obtained in the same manner as in Synthesis Example 1 except that the amount of BT2070 was changed to 30 parts and that pyromellitic acid anhydride was replaced with 55.8 parts (corresponding to 178% of molar amount of epoxy acrylate) of tetrahydrophthalic acid anhydride.

The above-obtained resin (to be referred to as "resin (iv)" hereinafter) had an acid value of 110.4 mgKOH/g.

Comparative Synthesis Example 1

115.7 Parts of dipropylene glycol monomethyl ether acetate/solvent naphtha (50/50) as a solvent were added to 100 parts of a bisphenol A type epoxy acrylate (trade name: SP1509, supplied by Showa Kobunshi) and 15.7 parts of (corresponding to 50% of molar amount of epoxy acrylate) of tetrahydrophthalic acid anhydride, to prepare a mixture having a solid content of 50%.

While the mixture was stirred at 70° C., the mixture was allowed to react with monitoring a carboxylic acid anhydride peak (around 1,850 cm$^{-1}$) based on an infrared absorption spectrum. After 6 hours, the carboxylic acid anhydride peak disappeared, so that the reaction was terminated.

The above-obtained resin (to be referred to as "resin (v)" hereinafter) had an acid value of 50.0 mgKOH/g.

Example 1

The resin (i) prepared in Synthesis Example 1 and other components shown in Table 1 were kneaded in amounts shown in Table 1 with a three-roll mill (supplied by Aimex), and the resultant composition (resist ink) was applied onto a mechanically surface-polished copper-clad laminate by a screen printing machine (LS15GX, supplied by Newlong Seimitsu Kogyo) to form a coating having a thickness of 40 μm.

The copper-clad laminate with the coating was placed in a dryer having a temperature of 70° C. for 30 minutes until no tackiness of the coating was found.

An exposure pattern film was placed on the coating, and the coating was exposed to light with a parallel aligner at a light quantity of 500 mJ/cm$^2$.

After the exposure, development was carried out with a 1% sodium carbonate aqueous solution under a spray pressure of 1.5 kg/cm$^2$ for 60 seconds. The resultant coating was washed with water, placed in a hot air dryer and cured under heat at 160° C. for 1 hour.

The so-prepared test piece with a cured coating on it was evaluated or measured for a Tg, adhesion, heat durability against soldering, heat durability against soldering after humidification, durability against electroless nickel plating and electric insulation by the following methods.

Table 2 shows the results.

The testing or evaluation methods were as shown below.

Tg measurement (measurement of glass transition temperature): A coating formed on a substrate (copper-clad laminate) by applying a resist ink once or twice was peeled off from the substrate, and the coating was measured with a TMA tension tester according to JIS C 6481.

Adhesion: According to JIS K 5400, a cured coating was cross-cut at intervals of 1 mm with a knife, a peeling off test was carried out with a Cellophane tape, and a state after the peeling off test was visually evaluated.

A=100/100 (no peeling),

B=(more than 90 - less than 100)/100,

X=90/100 or less

Heat durability against soldering: According to JIS C 6481, a test piece was immersed in a solder bath having a temperature of 260° C. for 30 seconds, and the test piece was evaluated for an appearance (before humidification). Further, the test piece before the immersing was placed in a pressure cooker for 1 hour and taken out, and it was evaluated for an appearance (after humidification).

A: solder was no change in appearance.

B: solder was discolored.

X: solder was not partly adhering.

Durability against electroless nickel plating: After the development, a developed surface was visually observed, and then electroless nickel plating (pH 4.5, immersion at 90° C. for 20 minutes) was carried out. A nickel-plated state was visually observed to evaluate developability and durability against the nickel plating.

A: Nickel plating was adhering excellently.

B: Nickel plating was adhering excellently, but a coating was discolored.

X: Nickel plating was not adhering (resin remains).

Evaluation of electric insulation: A test piece was prepared by applying a resist ink to a comb-shaped pattern formed according to IPC-TM-650 No. 2.6.3 (trade name of copper-clad laminate used: CCL-HL830, supplied by Mitsubishi Gas Chemical Co., Inc.). The test piece was trated at 85° C. at 85%RH for 500 hours, then allowed to stand in a 60%RH atmosphere for 10 minutes and measured for an insulation resistance.

Examples 2 to 6

The resins (i) to (iv) obtained in Synthesis Examples 1 to 4 were used in amounts as shown in Table 1, and resist inks having compositions shown in Table 1 were prepared. Example 1 was repeated with regard to each of the resist inks, and the resist inks were evaluated or measured in the same manner as in Example 1. Table 2 shows the results.

Comparative Example 1

The resin (v) obtained in Comparative Synthesis Example 1 was used in an amount as shown in Table 1, and a resist ink having a composition shown in Table 1 was prepared. Example 1 was repeated with regard to the resist ink, and the resist ink was evaluated or measured in the same manner as in Example 1. Table 2 shows the results.

Comparative Example 2

100 Parts of the resin (v) obtained in Comparative Synthesis Example 1 was used together with 10 parts of bisphenol A type cyanate ester compound (BT2070), and a resist ink having a composition shown in Table 1 was prepared. Example 1 was repeated with regard to the resist ink, and the resist ink was evaluated or measured in the same manner as in Example 1. Table 2 shows the results.

TABLE 1

|  | Example | | | | | | Comparative Example | |
| --- | --- | --- | --- | --- | --- | --- | --- | --- |
|  | 1 | 2 | 3 | 4 | 5 | 6 | 1 | 2 |
| Resins (i)–(v) | (i) | (ii) | (iii) | (iv) | (i) | (i) | (v) | (v) |
| (part) | 50 | 50 | 50 | 50 | 25 | 25 | 50 | 50 |
|  |  |  |  |  | (ii) | (iv) |  |  |
|  |  |  |  |  | 25 | 25 |  |  |
| BT2070 | — | — | — | — | — | — | — | 5 |
| TGIC | 15 | 15 | — | — | 15 | — | 15 | 15 |
| Denacal T | — | — | 15 | 15 | — | 15 | — | — |
| Irgacure 651 | 5 | 5 | 5 | 5 | 5 | 5 | 5 | 5 |
| BYK357 | 1 | 1 | 1 | 1 | 1 | 1 | 1 | 1 |
| BYK054 | 1 | 1 | 1 | 1 | 1 | 1 | 1 | 1 |
| Phthalocyanine Green | 1 | 1 | 1 | 1 | 1 | 1 | 1 | 1 |
| Imsil A108 | 30 | 30 | 30 | — | 30 | 5 | 30 | 30 |
| BST *200 | — | — | — | 20 | — | 15 | — | — |
| Barium sulfate | — | — | — | 10 | — | 10 | — | — |

Notes: Symbols in Tables stand for the followings.
TGIC: Triglycidyl isocyanurate
Denacal T: Xylene novolak type epoxy resin, supplied by Nagase Kasei.
Irgacure 651: Photopolymerization initiator, supplied by Ciba Geigy.
BYK357, BYK054: Anti-foamer, surfactant, supplied by BYE-Chemie.
Phthalocyanine Greein: Supplied by Sanyo Sikiso.
Imsil A108: Milled silica, supplied by Tatsumori.
BST #200: Surface-treated milled silica

TABLE 2

|  |  | Example | | | | | | Comparative Example | |
| --- | --- | --- | --- | --- | --- | --- | --- | --- | --- |
|  |  | 1 | 2 | 3 | 4 | 5 | 6 | 1 | 2 |
| Glass transition temperature (° C.) | | 136 | 133 | 135 | 130 | 135 | 132 | 105 | 130 |
| Adhesion | | A | A | A | A | A | A | A | A |
| Heat durability against soldering | Before humidification | A | A | A | A | A | A | A | A |
| | After humidification | A | A | A | A | A | A | X | A |
| Durability against electroless nickel plating | | A | A | A | A | A | A | A | X |
| Electric insulation ($\times 10^{12}$ Ω) | Before humidification | 15 | 14 | 16 | 14 | 15 | 15 | 10 | 10 |
| | After humidification | 0.1 | 0.2 | 0.3 | 0.5 | 0.2 | 0.3 | 0.001 | 0.3 |

A photosensitive resin composition containing a modified epoxy acrylate formed by reacting an epoxy acryalte with a cyanate ester compound and further reacting the resulting reaction product with an acid anhydride, provided by the present invention, has excellent developability and high heat resistance and shows excellent heat resistance and excellent electric insulation reliability in a humidified state.

What is claimed is:

1. A photosensitive resin (B) having an acid value of 50 to 130 and which is a reaction product produced by reacting an epoxy acrylate (a) with a cyanate ester compound (b) to obtain a reaction product (A) and reacting the reaction product (A) with a polybasic acid anhydride (c).

2. The photosensitive resin (B) according to claim 1, wherein the cyanate ester compound is a cyanate ester compound having at least one cyanato group per molecule.

3. The photosensitive resin (B) according to claim 2, wherein the cyanate ester compound is a cyanate ester compound in which 2 to 5 cyanato groups bond directly to an aromatic ring of the cyanate ester compound.

4. The photosensitive resin (B) according to claim 1, wherein the cyanate ester compound is a prepolymer having a triazine ring and having a molecular weight of 200 to 6,000.

5. The photosensitive resin (B) according to claim 1, wherein the polybasic acid anhydride is a compound having an acid anhydride group derived from at least 2 carboxyl groups per molecule.

6. The photosensitive resin (B) according to claim 1, wherein the cyanate ester compound (b) is used in an amount in the range of from 5 to 40 parts by weight per 100 parts by weight of the epoxy acrylate (a).

7. The photosensitive resin (B) according to claim 1, wherein the polybasic acid anhydride is used in an amount in the range of from 10 to 90 parts by weight per 100 parts by weight of the epoxy acrylate (a).

8. Resist ink comprising a photosensitive resin composition containing 30 to 90% by weight, based on the photosensitive resin composition, of photosensitive resin (B) which is a reaction product produced by reacting an epoxy acrylate (a) with a cyanate ester compound (b) to obtain a reaction product (A) and reacting the reaction product (A) with a polybasic acid anhydride (c) and an epoxy resin (d).

* * * * *